(12) United States Patent
Albrecht

(10) Patent No.: US 9,379,425 B2
(45) Date of Patent: Jun. 28, 2016

(54) SIGNAL SPLITTER

(75) Inventor: Adam Albrecht, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 1079 days.

(21) Appl. No.: 13/429,210

(22) Filed: Mar. 23, 2012

(65) Prior Publication Data

US 2013/0082711 A1    Apr. 4, 2013

(30) Foreign Application Priority Data

Mar. 24, 2011    (DE) .......................... 10 2011 006 059

(51) Int. Cl.
| | | |
|---|---|---|
| *G01V 3/00* | (2006.01) | |
| *H01P 5/12* | (2006.01) | |
| *G01R 33/36* | (2006.01) | |
| *H03H 7/42* | (2006.01) | |
| *H03H 7/48* | (2006.01) | |
| *G01R 33/34* | (2006.01) | |
| *H03F 3/68* | (2006.01) | |

(52) U.S. Cl.
CPC *H01P 5/12* (2013.01); *G01R 33/34* (2013.01); *G01R 33/3614* (2013.01); *H03F 3/68* (2013.01); *H03H 7/42* (2013.01); *H03H 7/48* (2013.01)

(58) Field of Classification Search
CPC ....................................... G01R 33/36
USPC ..................... 324/322, 318; 333/131, 124, 26
See application file for complete search history.

(56) References Cited

U.S. PATENT DOCUMENTS

| 4,916,410 | A | | 4/1990 | Littlefield | |
|---|---|---|---|---|---|
| 5,091,708 | A | * | 2/1992 | Bezjak | ............................ 333/26 |
| 6,621,374 | B2 | * | 9/2003 | Higgins et al. | ................ 333/124 |
| 6,750,652 | B2 | * | 6/2004 | Weyers et al. | ................ 324/318 |
| 8,063,716 | B1 | * | 11/2011 | Ives | .............................. 333/131 |
| 9,007,144 | B2 | * | 4/2015 | Kayahara | ...................... 333/131 |

FOREIGN PATENT DOCUMENTS

JP    2010-183167 A    8/2010

OTHER PUBLICATIONS

German Office Action dated Sep. 29, 2011 for corresponding German Patent Application No. DE 10 2011 006 059.6 with English translation.

* cited by examiner

*Primary Examiner* — Louis Arana
(74) *Attorney, Agent, or Firm* — Lempia Summerfield Katz LLC

(57) ABSTRACT

A signal splitter for creating at least two symmetrical equal-power signals from an input signal for use in an amplifier device includes at least one input terminal pair and at least two output terminal pairs. A primary conductor structure supplied from the at least one input terminal pair is provided for induction of a current flow in at least two secondary conductor structures each connected to an output terminal pair of the at least two output terminal pairs and the at least two secondary conductor structures. A center of a conductor length of each of the at least two secondary conductor structures is connected to ground, and the primary conductor structure and the at least two secondary conductor structures are realized as conductor tracks applied to a printed circuit board.

19 Claims, 2 Drawing Sheets

SIGNAL SPLITTER

This application claims the benefit of DE 10 2011 006 059.6, filed on Mar. 24, 2011.

BACKGROUND

The present embodiments relate to a signal splitter for creating at least two symmetrical signals from one input signal.

Signal splitters (e.g., splitters or power dividers) are basically known. They serve to split an input signal into at least two output signals. For example, at least two output signals of the same power may be created. These types of signal splitters may also be used (e.g., for creating signals of equal power) in magnetic resonance technology. Magnetic resonance devices have now become widely used and well-known (e.g., in clinical applications). In such cases, nuclear resonance aligned via a transmit antenna of an object under examination is excited in the magnetic resonance device, and the image data is recorded by a receive coil. To operate the transmit antenna, high power (e.g., in the kilowatt range) is used. The high power is provided by a power amplification device that may be installed in a transmit unit of the magnetic resonance device.

For this purpose, these types of power amplification devices may include different amplification modules (final stages). For example, four amplification modules that may each generate an output power of 5-8 kW may be included, so that in combination, a power of, for example, 30 kW may be obtained.

In order to split the input signal (e.g., already lying in the range of the magnetic frequency) to be amplified by the power amplifier device for the different amplifier modules, a Wilkinson splitter may be used. Downstream of the Wilkinson splitter a balun is connected in each case for creating a symmetrical input signal for the amplifier modules. A number of Wilkinson splitters may also be used if more than two amplifier modules are to be controlled. Such signal splitting and symmetrization is realized in such cases either by coaxial leads or by discrete elements. Both solutions have disadvantages because the first solution uses a large space, and the second solution uses coils of very high quality (e.g., with a tolerance <2%). The high quality coils are very expensive and may also create space problems when installed. The result of the problems is that, because of non-ideal implementations, the maximum output power may be reduced, since no exact phase-opposed input signals are present at the amplifier modules.

SUMMARY AND DESCRIPTION

The present embodiments may obviate one or more of the drawbacks or limitations in the related art. For example, a signal splitter is realized as a compact device and without using coils with high tolerance requirements.

In one embodiment, a signal splitter includes a primary conductor structure supplied by an input terminal pair configured for induction of a current flow in at least two secondary conductor structures connected to an output terminal pair and the at least two secondary conductor structures. A center of a conductor length of each secondary conductor structure is connected to ground, and the primary conductor structure and the at least two secondary conductor structures are realized as conductor tracks applied to a printed circuit board.

The signal splitting is achieved on an inductive path such that a primary conductor structure realized as a conductor track on a printed circuit board induces signals in the at least two secondary conductor structures also realized as conductor tracks on a printed circuit board. A structure lying in one plane is thus produced. The primary conductor structure, which may be embodied as a loop, for example, is tuned as a resonant circuit, for which at least one capacitor is used. Capacitors with low easy-to-achieve tolerances in the range of 1% are readily obtainable and widely used. Thus, no coils realized as discrete components are needed. The overall number of discrete components is also minimized.

Phase-opposed output signals are tapped off, in each case, at an end of the secondary conductor structures. An output terminal is provided in each case at one end of the conductor track implementing the secondary conductor structure.

The phase opposition of the signals obtained from the induced signals is ultimately realized by the connection to ground provided at the center of the line length of each secondary conductor structure. As a result of the one "winding direction" of the secondary structure, a phase-opposed signal is produced at the two ends of the conductor track that is formed. This provides signals displaced by 180° at the output terminals of an output terminal pair.

As well as the advantage of this solution not needing any discrete coils and only a minimal number of discrete components, the line structures are advantageously applied to a conductor track (e.g., printed on), so that the line structures may be easily reproduced. The overall design is very compact, since only the at least one capacitor is needed as a component. A number of output pairs with phase-opposed signals may be obtained by a printed structure that also lies in one plane (the plane of the printed circuit board).

In one embodiment, the primary conductor structure may surround the at least two secondary conductor structures as a loop. The signal splitter may be made even more compact, since the surface surrounded by the loop is used for the provision of the secondary conductor structures. The loop may have a shape (e.g., indentations) that ultimately separates the areas, in which secondary conductor structures are provided, from each other. The primary conductor structure in the case of two secondary conductor structures may essentially run around the edges of a U-shaped form, and the secondary conductor structures may be arranged in the limbs of the U. The primary conductor structure in such a case also may not form a loop running completely in the shape of a rectangle. In the center, the primary conductor structure may be routed into a section that is rectangular (e.g., on one side into the inside of the rectangle so that overall a shape that is comparable with that of a letter U is produced). The input signal pair may, for example, be connected in the opposite area, thus ultimately the "base line" of the U. The capacitor used for resonance tuning is arranged between the terminals. Thus, a symmetrical shape is also produced overall. The symmetrical shape is to be provided if there is to be an even power splitting to the output signals of the signal splitter. Other structures may also be provided so that, for example, the primary conductor structure for the provision of four secondary conductor structures essentially follows the outline of a letter H.

It is advantageous for the arrangement of the primary conductor structure and the secondary conductor structure at least to exhibit symmetry. If the arrangement is formed so that, with an applied input signal, an equal induction occurs in the different secondary conductor structures, essentially equal-power output signals may be achieved at the pairs of output terminals.

In one embodiment, the secondary conductor structures may each have at least two windings (e.g., three windings).

This provides that the conductor tracks of the secondary conductor structures may, for example, be provided running in the shape of a spiral on the printed circuit board, so that the secondary conductor structures have a number of windings and thus offer a larger attack area for the induction. Excellent space utilization is also produced in this way.

A first capacitor for forming a resonant circuit may be connected between the input terminals terminating the primary conductor structure. This is a procedure for obtaining a resonant circuit, so that the inductive coupling to the secondary conductor structures may take place. The center of the line length of the primary conductor structure may be connected to ground by a second capacitor. Such a second capacitor serves to block off harmonic frequencies and other faults (e.g., duplicated resonant frequency). Capacitors with a tolerance of 1% or less are widely used and easily obtainable.

If the input signal is formed by a drain output of a transistor, a voltage basically available at the drain output is provided. A power supply may be connected via the second capacitor to the primary conductor structure. This is used, for example, if the input signal is delivered from a driver transistor of a power amplifier device.

The present embodiments also relate to an amplifier device (e.g., for a transmit unit of a magnetic resonance device). A basic signal to be amplified is provided by an input-side driver transistor, and at least one signal splitter of the present embodiments for splitting the signal to at least two amplifier modules that each deliver a part of the overall power of the amplifier device, is provided. All embodiments for the signal splitter are able to be transferred similarly to the power amplifier device of the present embodiments, so that the advantages already described may also be obtained with the device.

The signal splitter of the present embodiments may be used advantageously in an amplifier device, since amplifier modules may use phase-opposed input signals based on the push-pull principle currently used in amplifier modules. The lead from the signal splitter to the different amplifier modules may advantageously be configured to be the same length, and a balun may not be used before the amplifier module input. With a design of the amplifier device, it is thus possible to control the different amplifier modules without any problem in the same phase with a symmetrical signal without any further symmetry element (balun) being needed.

In one embodiment, the amplifier module, the signal splitter and the driver transistor may be realized on a common circuit board. This makes a further compact embodiment of the amplifier device possible, since the signal splitter, as has already been explained, is primarily realized by conductor structures printed onto a circuit board. The conductor structures may be easily integrated into an overall conductor tracks structure of an individual circuit board for the amplifier device.

The present embodiments also relate to a magnetic resonance device including a transmit unit with one embodiment of an amplifier device. What has been discussed above in relation to the signal splitter and the amplifier device also applies equally to the magnetic resonance device. Even with power amplifier devices of magnetic resonant devices, it was previously normal practice to use Wilkinson splitters, which have the disadvantages described above. The present embodiments represent a marked improvement, since with magnetic resonant devices, phase-opposed final stages are also frequently used as amplifier modules. Phase-opposed final stages use a symmetrical signal for operation, so that the signal splitter of the present embodiments may replace the Wilkinson splitter and the balun connected upstream from the amplifier modules.

DETAILED DESCRIPTION OF THE DRAWINGS

Figure 1:
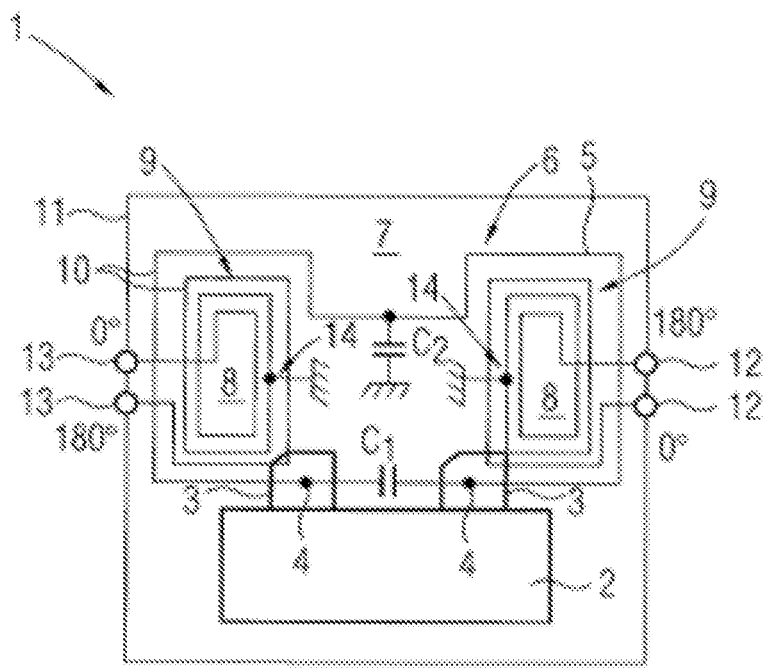
FIG. 1 shows one embodiment of a signal splitter.

FIG. 1 shows one embodiment of a signal splitter 1, with a driver transistor 2 having two drain outputs 3 also being shown. This delivers the input signal for the signal splitter 1.

The two drain outputs 3 are connected to an input terminal pair 4 of the signal splitter 1. The input signal is presented to a primary conductor structure 5 that is embodied in the form of a loop 6. The loop 6 is closed by a capacitor $C_1$ provided between the input terminals 4. The loop 6 is dimensioned so that a resonant circuit at the frequency of the input signal is formed. The frequency of the input signal corresponds to the magnetic resonance frequency of a magnetic resonance device, which is explained in greater detail below.

A second capacitor $C_2$ serves to suppress high-frequency noise signals and harmonics. A power supply (not shown in any greater detail) is also connected via the second capacitor $C_2$, which makes the necessary basic voltage that is to be present at the drain outputs 3 of the driver transistor 2 available.

In one embodiment, the loop 6 essentially follows the outline of a letter U. This provides that the basic rectangular structure has a central indentation 7 on a side lying opposite the input terminal pair 4. The central indentation 7, for example, splits two areas 8 formed by limbs of the U. A secondary conductor structure 9 is provided in each of the two areas 8. A current may be induced in the secondary conductor structure 9 by the primary conductor structure 5.

Both the primary conductor structure 5 and the secondary conductor structures 6 may be realized as conductor tracks 10 on a printed circuit board 11, so that the only discrete components of the signal splitter 1 are the capacitors $C_1$ and $C_2$. The layout additionally produces a very compact design. The space in the areas 8 may be used by the spiral structure of the conductor track 10 of the secondary conductor structures 9 forming a number of windings.

Ends of the conductor tracks 10 forming the secondary conductor structure are each connected to output terminal pairs 12, 13, at which a symmetrical signal is to be tapped off. This is realized by a center 14 of the length of the conductor track 10 of the secondary conductor structures 9 being connected to ground, as shown in FIG. 1.

The results of the overall symmetry of the arrangement of the conductor structures 5, 9 is that essentially the same power is obtained at the output terminal pairs 13, 12, and the same symmetrical signal in relation to the phase position is output.

Figure 2:
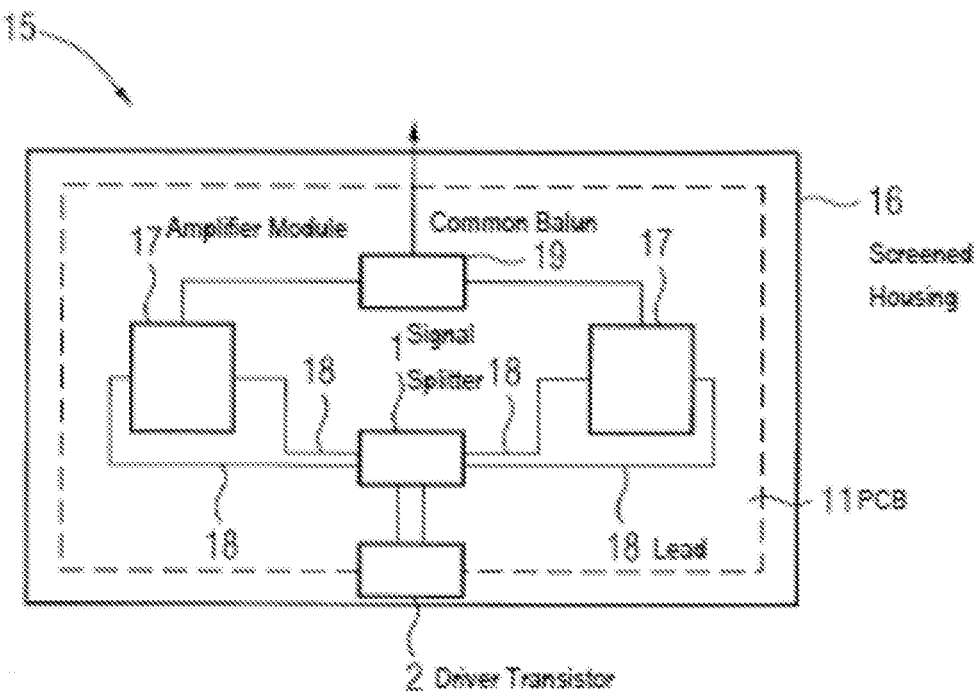
FIG. 2 shows one embodiment of an amplifier device.

FIG. 2 shows a basic diagram of relevant components of one embodiment of an amplifier device 15 that may be used in the transmit unit of a magnetic resonance device. A printed circuit board 11 for all components is arranged in a screened housing 16. A basic signal is output as an input signal via the driver transistor 2 to the signal splitter 1, which creates two symmetrical, equal power output signals from the signal. The two output signals are supplied to different inputs of two amplifier modules 17 embodied as push-pull final stages. Leads 18 to the various inputs are embodied to be the same length for both amplifier modules 17.

Each of the amplifier modules 17 delivers part of the overall power so that the output signal of the amplifier module 17 is merged via a common balun 19. This is provided, since the high-frequency antenna of the magnetic resonant device is to be controlled by an asymmetrical signal.

Other arrangements with more than two amplifier modules 17 (e.g., with four amplifier modules) may be realized in a similar way. In such cases, a number of signal splitters 1 with two output terminal pairs 12, 13 or one embodiment of a signal splitter with more than two output terminal pairs may be used.

Figure 3:
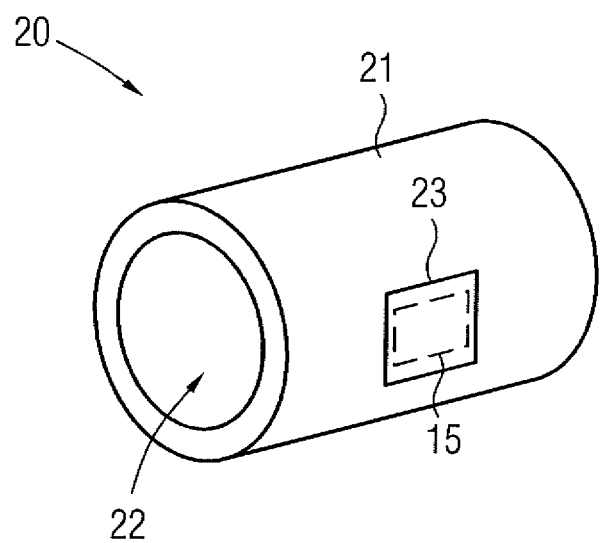
FIG. 3 shows one embodiment of a magnetic resonance device.

FIG. 3 shows one embodiment of a magnetic resonance device 20. The magnetic resonance device 20 includes a main magnet unit 21 including coils for generating a main magnetic field with a patient chamber 22. A transmit unit 23 is arranged on the outside of the main magnet unit 21. The transmit unit 23 includes one embodiment of the power amplifier device 15.

Further components of the magnetic resonant device 20 are known in the prior art and are not presented in any greater detail here.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A signal splitter operable to create at least two symmetrical signals from an input signal, the signal splitter comprising:
   at least one input terminal pair;
   at least two output terminal pairs;
   a primary conductor structure supplied from the at least one input terminal pair; and
   at least two secondary conductor structures, each of the at least two secondary conductor structures being connected to an output terminal pair of the at least two output terminal pairs, the primary conductor structure being for induction of a current flow in the at least two secondary conductor structures,
   wherein a center of a line length of each secondary conductor structure of the at least two secondary conductor structures is connected to ground,
   wherein the primary conductor structure and the at least two secondary conductor structures comprise conductor tracks applied to a printed circuit board, and
   wherein the primary conductor structure surrounds the at least two secondary conductor structures as a loop.

2. The signal splitter as claimed in claim 1, wherein the primary conductor structure substantially runs in a U-shape, and
   wherein the at least two secondary conductor structures are arranged in limbs of the U-shape.

3. The signal splitter as claimed in claim 2, wherein an arrangement of the primary conductor structure and the at least two secondary conductor structures exhibits at least one symmetry.

4. The signal splitter as claimed in claim 1, wherein an arrangement of the primary conductor structure and the at least two secondary conductor structures exhibits at least one symmetry.

5. The signal splitter as claimed in claim 4, wherein each of the at least two secondary conductor structures comprises at least two windings.

6. The signal splitter as claimed in claim 4, wherein a first capacitor for forming a resonant circuit is connected between input terminals of the at least one input terminal pair terminating the primary conductor structure, a center of a conductor length of the primary conductor structure is connected to ground via a second capacitor, or a combination thereof.

7. The signal splitter as claimed in claim 1, wherein each of the at least two secondary conductor structures comprises at least two windings.

8. The signal splitter as claimed in claim 7, wherein the at least two windings comprise three windings.

9. The signal splitter as claimed in claim 1, wherein a first capacitor for forming a resonant circuit is connected between input terminals of the at least one input terminal pair terminating the primary conductor structure, a center of a conductor length of the primary conductor structure is connected to ground via a second capacitor, or a combination thereof.

10. The signal splitter as claimed in claim 9, wherein a power supply is connected via the second capacitor to the primary conductor structure.

11. The signal splitter as claimed in claim 10, wherein the power supply is connected via the second capacitor to the primary conductor structure when power is supplied to the signal splitter via an output of a transistor.

12. The signal splitter as claimed in claim 1, wherein the at least two symmetrical signals are equal power signals.

13. The signal splitter as claimed in claim 1, wherein each of the at least two secondary conductor structures comprises at least two windings.

14. The signal splitter as claimed in claim 1, wherein a first capacitor for forming a resonant circuit is connected between input terminals of the at least one input terminal pair terminating the primary conductor structure, a center of a conductor length of the primary conductor structure is connected to ground via a second capacitor, or a combination thereof.

15. An amplifier device comprising:
   an input-side driver transistor operable to provide a basic signal to be amplified; and
   at least one signal splitter operable to split the basic signal to at least two amplifier modules, the at least two amplifier modules each delivering part of an overall power of the amplifier device, the at least one signal splitter comprising:
      at least one input terminal pair;
      at least two output terminal pairs;
      a primary conductor structure supplied from the at least one input terminal pair; and
      at least two secondary conductor structures, each of the at least two secondary conductor structures being connected to an output terminal pair of the at least two output terminal pairs, the primary conductor structure being for induction of a current flow in the at least two secondary conductor structures,
   wherein a center of a line length of each secondary conductor structure of the at least two secondary conductor structures is connected to ground,
   wherein the primary conductor structure and the at least two secondary conductor structures comprise conductor tracks applied to a printed circuit board, and
   wherein the primary conductor structure surrounds the at least two secondary conductor structures as a loop.

16. The amplifier device as claimed in claim 15, wherein leads from the at least one signal splitter to the at least two amplifier modules are designed to be a same length, and
   wherein no balun is used before an input of the at least two amplifier modules.

17. The amplifier device as claimed in claim 16, wherein the at least two amplifier modules, the at least one signal splitter, and the input-side driver transistor are provided on a common printed circuit board.

18. The amplifier device as claimed in claim 15, wherein the at least two amplifier modules, the at least one signal splitter, and the input-side driver transistor are provided on a common printed circuit board.

19. A magnetic resonance device comprising:
- a transmit unit comprising an amplifier device, the amplifier device comprising:
  - an input-side driver transistor operable to provide a basic signal to be amplified; and
  - at least one signal splitter operable to split the basic signal to at least two amplifier modules, the at least two amplifier modules each delivering part of an overall power of the amplifier device, the at least one signal splitter comprising:
    - at least one input terminal pair;
    - at least two output terminal pairs;
    - a primary conductor structure supplied from the at least one input terminal pair; and
    - at least two secondary conductor structures, each of the at least two secondary conductor structures being connected to an output terminal pair of the at least two output terminal pairs, the primary conductor structure being for induction of a current flow in the at least two secondary conductor structures, wherein a center of a line length of each secondary conductor structure of the at least two secondary conductor structures is connected to ground, wherein the primary conductor structure and the at least two secondary conductor structures comprise conductor tracks applied to a printed circuit board, and wherein the primary conductor structure surrounds the at least two secondary conductor structures as a loop.

* * * * *